(12) United States Patent
Chang

(10) Patent No.: US 10,961,115 B2
(45) Date of Patent: Mar. 30, 2021

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventor: Kuei-Sung Chang, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 11 days.

(21) Appl. No.: 16/249,634

(22) Filed: Jan. 16, 2019

(65) Prior Publication Data
US 2020/0223688 A1 Jul. 16, 2020

(51) Int. Cl.
| B81B 7/00 | (2006.01) |
| B81B 7/02 | (2006.01) |
| B81C 1/00 | (2006.01) |
| H01L 23/00 | (2006.01) |

(52) U.S. Cl.
CPC .......... *B81B 7/0096* (2013.01); *B81B 7/0038* (2013.01); *B81B 7/02* (2013.01); *B81C 1/00047* (2013.01); *H01L 24/09* (2013.01); *B81B 2201/0235* (2013.01); *B81B 2201/0264* (2013.01); *B81B 2201/0278* (2013.01); *B81B 2203/0315* (2013.01); *B81B 2207/096* (2013.01); *H01L 2924/3511* (2013.01); *H01L 2924/35121* (2013.01)

(58) Field of Classification Search
CPC ....... B81B 7/0096; B81B 7/02; B81B 7/0038; B81B 2201/0235; B81B 2201/0278; B81B 2203/0315; B81B 2201/0264; B81B 2207/096; B81C 1/00047; H01L 24/09; H01L 2924/3511; H01L 2924/35121
See application file for complete search history.

(56) References Cited

U.S. PATENT DOCUMENTS

2015/0158720 A1* 6/2015 Lim .................... B81C 1/00285
257/415

* cited by examiner

*Primary Examiner* — Patricia D Reddington
(74) *Attorney, Agent, or Firm* — WPAT, P.C., Intellectual Property Attorneys; Anthony King

(57) ABSTRACT

A semiconductor structure includes a first substrate; a heater surrounded by the first substrate; a pressure adjusting material disposed over the first substrate and adjacent to the heater; a second substrate disposed over the first substrate; and a cavity enclosed by the first substrate and the second substrate, wherein the pressure adjusting material is disposed within the cavity.

20 Claims, 9 Drawing Sheets

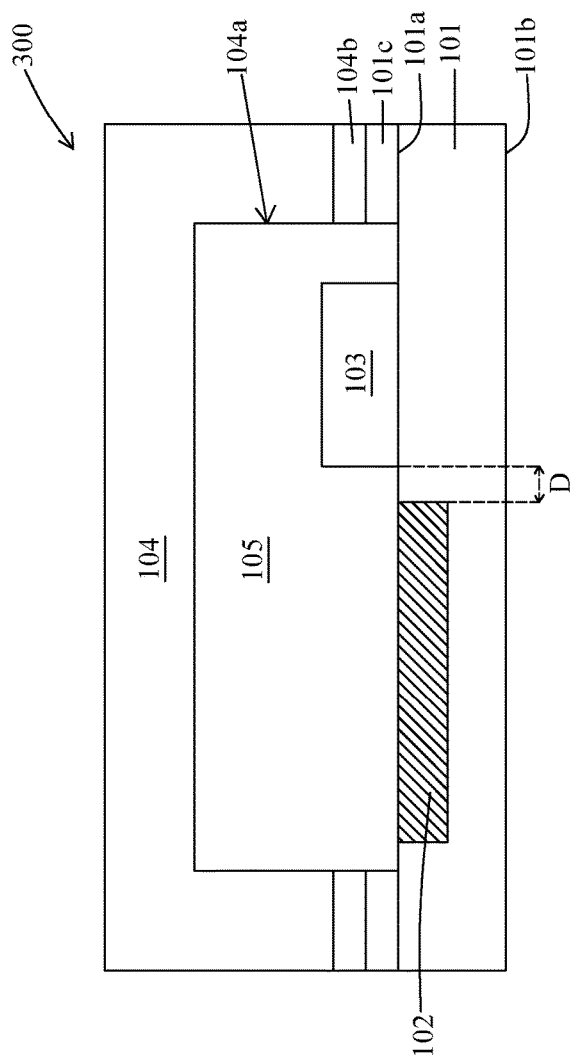
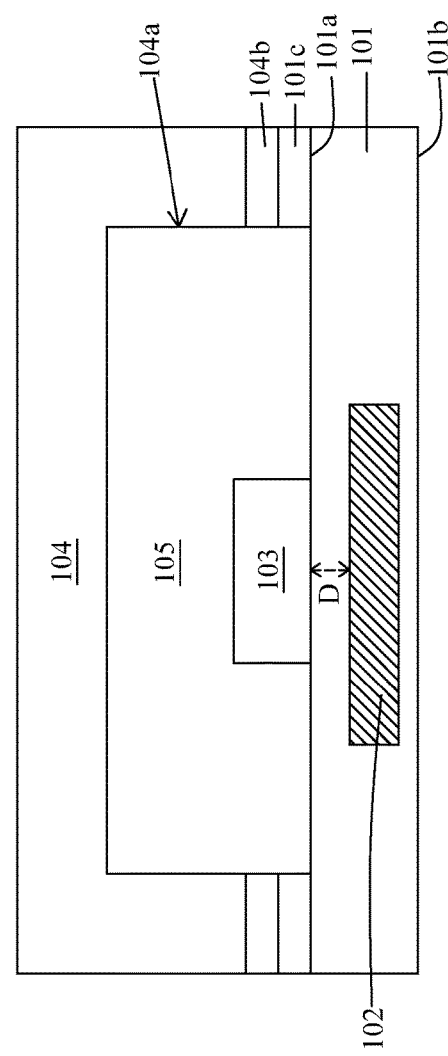
FIG. 3
FIG. 4

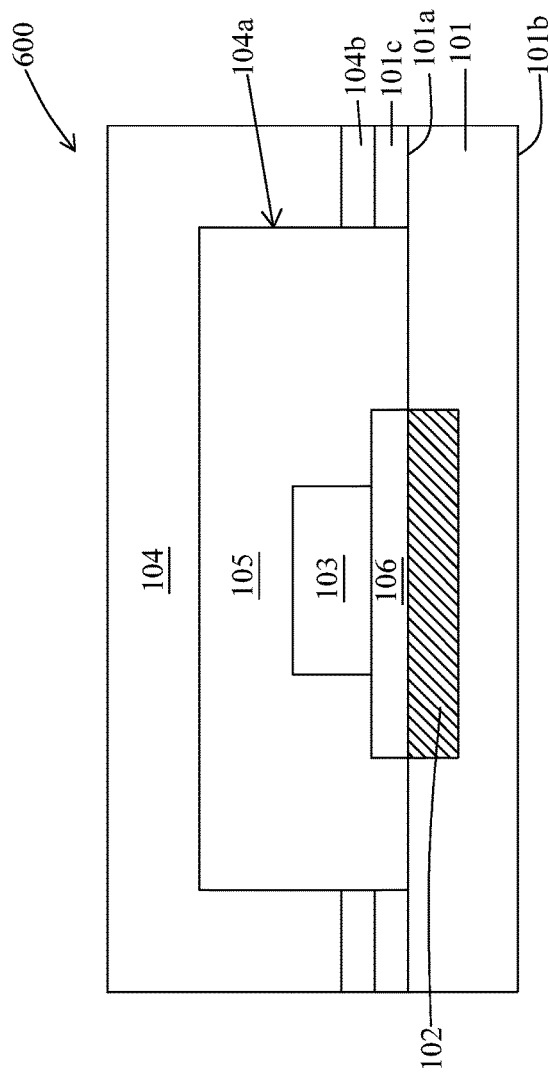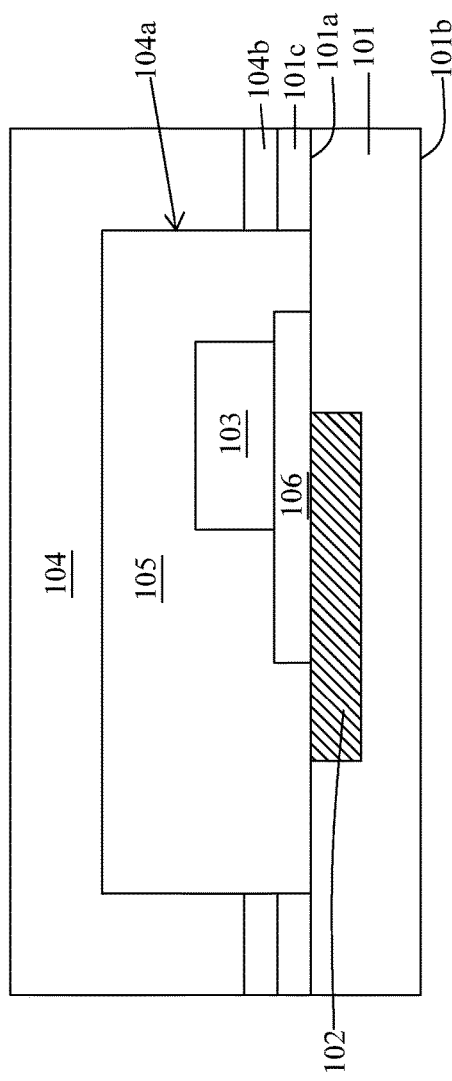
FIG. 6
FIG. 7

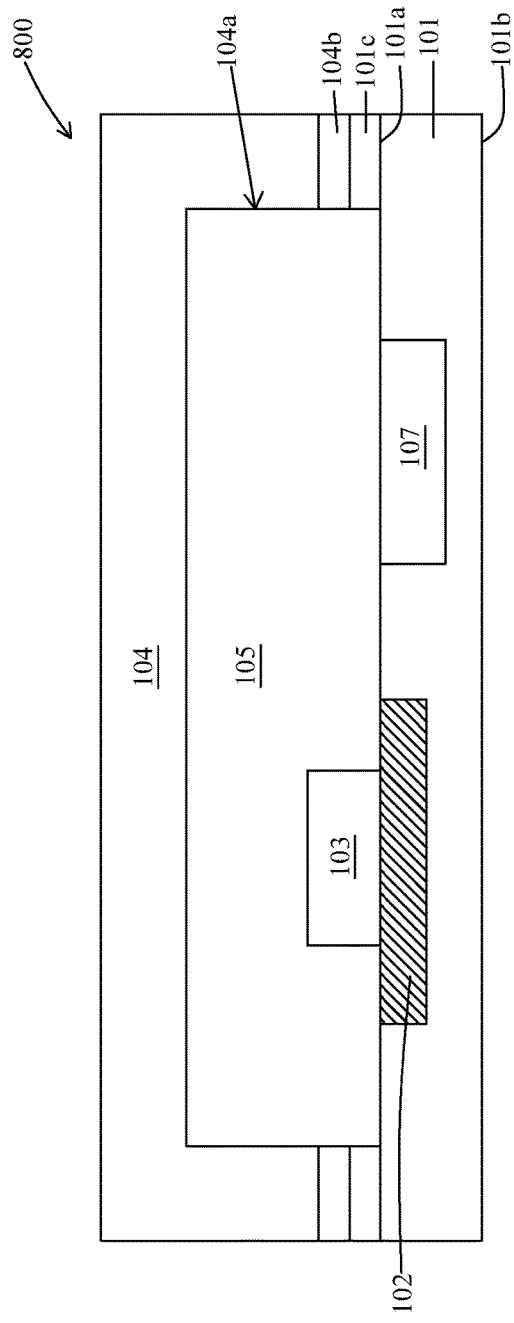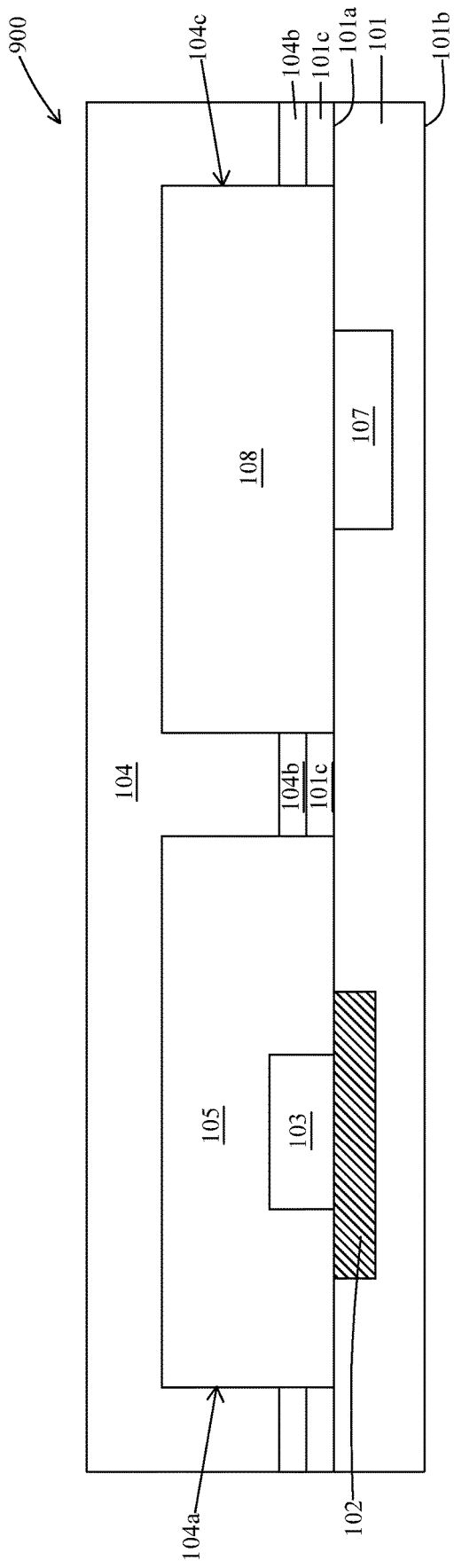
FIG. 8
FIG. 9

SEMICONDUCTOR STRUCTURE AND MANUFACTURING METHOD THEREOF

BACKGROUND

Electronic equipment involving semiconductive devices are essential for many modern applications. The semiconductive device has experienced rapid growth. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

Numerous manufacturing operations are implemented within such a small and high performance semiconductor device. The manufacturing of the semiconductor device in a miniaturized scale becomes more complicated. The increase in complexity of manufacturing may cause deficiencies such as delamination of components, development of cracks, poor electrical interconnection, warpage, etc.

Therefore, there is a continuous need to modify structure and manufacturing method of the semiconductive devices in order to improve performance and reliability of the semiconductive device as well as efficiency of manufacturing of the semiconductive device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 3 is a schematic view of a semiconductor structure in accordance with some embodiments of the present disclosure.

FIG. 4 is a schematic view of a semiconductor structure in accordance with some embodiments of the present disclosure.

FIG. 6 is a schematic view of a semiconductor structure in accordance with some embodiments of the present disclosure.

FIG. 7 is a schematic view of a semiconductor structure in accordance with some embodiments of the present disclosure.

FIG. 8 is a schematic view of a semiconductor structure in accordance with some embodiments of the present disclosure.

FIG. 9 is a schematic view of a semiconductor structure in accordance with some embodiments of the present disclosure.

DETAILED DESCRIPTION OF THE DISCLOSURE

Figure 1:
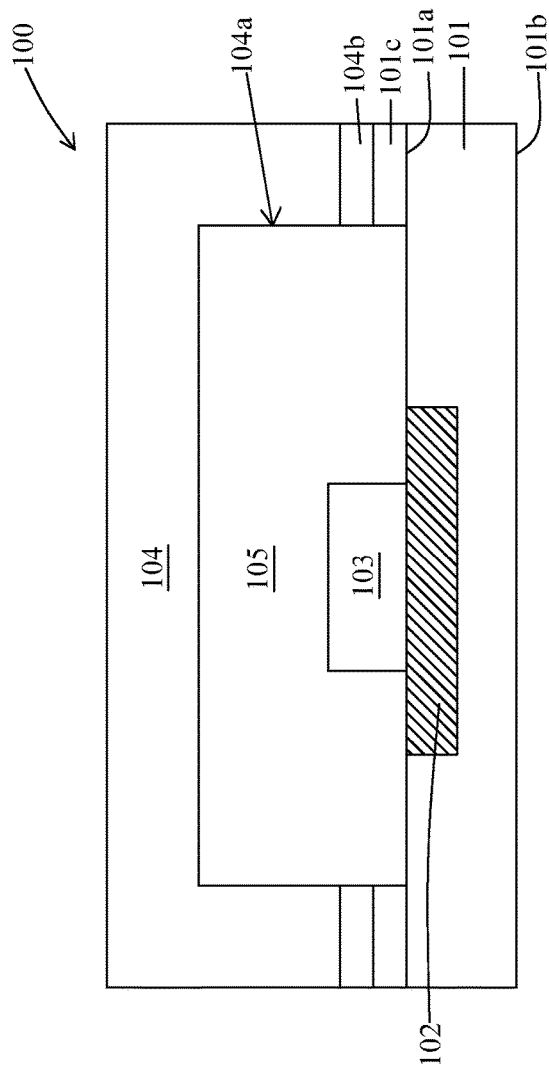
FIG. 1 is a schematic view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor structure typically involves a substrate and a circuitry disposed over the substrate. The circuitry includes several electrical components disposed over the substrate and several conductive lines electrically connecting the electrical components. Different electrical components may require operating under different conditions. For example, an accelerometer is operated under a higher (i.e. greater than an atmospheric pressure) gas pressure. As such, a capping substrate is bonded over the substrate to form a cavity enclosing one or more of the electrical components, so as to provide suitable operation environment to those electrical components. The cavity is sealed by the capping substrate.

After the formation of the cavity, the substrate is heated, and the heat energy is conducted from the substrate to a pressure adjusting material disposed over the substrate and within the cavity. The pressure adjusting material is heated, and a predetermined gas is released within the cavity to increase a gas pressure of the cavity. However, some of the electrical components over the substrate are easily deteriorated by a high temperature. The heating of the substrate may cause damage on some of the electrical components and thus adversely affect performance and reliability of the semiconductor structure.

In the present disclosure, a semiconductor structure is disclosed. The semiconductor structure includes a first substrate, a heater surrounded by the first substrate, a pressure adjusting material disposed over the first substrate and adjacent to the heater, a second substrate disposed over the first substrate, and a cavity enclosed by the first substrate and the second substrate. The pressure adjusting material is disposed within the cavity. Since the heater is disposed adjacent to the pressure adjusting material, heat emitted from the heater is conducted to the pressure adjusting material. As such, other components (especially temperature sensitive components such as accelerometer, etc.) disposed over the substrate are not affected by the heating of the pressure adjusting material. Therefore, damage of other components over the substrate can be minimized or prevented. Other embodiments are also disclosed.

FIG. 1 is a schematic cross sectional view of a semiconductor structure 100 in accordance with some embodiments of the present disclosure. In some embodiments, the semiconductor structure 100 is a part of a device, a package or a wafer. In some embodiments, the semiconductor structure 100 is a part of a micro-electro mechanical system (MEMS) device. In some embodiments, the semiconductor structure 100 is configured for sensing various characteristics such as motion, movement, magnetic field, pressure or etc. or combination thereof. In some embodiments, the semiconductor structure 100 is configured for sensing linear motion, angular motion, etc.

In some embodiments, the semiconductor structure 100 includes a first substrate 101, a heater 102 disposed over or within the first substrate 101, a pressure adjusting material 103 disposed over the first substrate 101, a second substrate 104 bonded over the first substrate 101 and a cavity 105 defined by the first substrate 101 and the second substrate 102.

In some embodiments, the first substrate 101 is fabricated with a predetermined functional circuit over the first substrate 101. In some embodiments, the first substrate 101 includes several conductive lines and several electrical components such as transistor, diode, etc. connected by the conductive lines. In some embodiments, the first substrate 101 is a semiconductive substrate. In some embodiments, the first substrate 101 includes semiconductive material such as silicon, germanium, gallium, arsenic, or combinations thereof. In some embodiments, the first substrate 101 includes organic material. In some embodiments, the first substrate 101 is a device substrate or a device wafer. In some embodiments, a cross sectional area of the first substrate 101 is in a quadrilateral, rectangular, square, polygonal or any other suitable shapes.

In some embodiments, the first substrate 101 includes a first surface 101*a* and a second surface 101*b* opposite to the first surface 101*a*. In some embodiments, the first surface 101*a* is substantially parallel to the second surface 101*b*. In some embodiments, the first surface 101*a* is a front side or active side of the first substrate 101. In some embodiments, the second surface 101*b* is a back side or an inactive side of the first substrate 101.

In some embodiments, the heater 102 is disposed over the first substrate 101. In some embodiments, the heater 102 is surrounded by the first substrate 101. In some embodiments, the heater 102 is disposed over the first surface 101*a* of the first substrate 101. In some embodiments, the heater 102 is partially exposed from the first substrate 101. In some embodiments, the heater 102 is extended over or within the first substrate 101.

In some embodiments, the heater 102 is a part of a circuitry of the first substrate 101. In some embodiments, the heater 102 is an electrical component electrically connected to a conductive structure in the first substrate 101. In some embodiments, the heater 102 is a portion of a conductive line in the first substrate 101. In some embodiments, a top cross-section of the heater 102 can be in any suitable shapes such as rectangular, circular, spiral, S, honeycomb, meander, etc. In some embodiments, the heater 102 includes platinum, copper, tungsten, nickel, polysilicon or any other suitable materials.

In some embodiments, the heater 102 is electrically connected to a power supply. In some embodiments, the heater 102 is electrically connected to an input/output (I/O) terminal pad of a circuitry of the first substrate 101. In some embodiments, an electric current is flowed from the I/O terminal pad to the heater 102. In some embodiments, the heater 102 is configured to generate and emit heat. In some embodiments, the heater 102 emits heat when a voltage is applied to the heater 102 or an electric current is flowed through the heater 102. In some embodiments, the heater 102 is a heat emitting resistor. In some embodiments, the heater 102 is a thin film resistor. In some embodiments, the heater 102 is an electric coil. In some embodiments, the heater 102 is a micro-heater or micro-heatplate. In some embodiments, the heater 102 is a MEMS component. In some embodiments, the heater 102 is a resistor with an electrical resistance substantially greater than 100Ω (Ohm). In some embodiments, the electrical resistance of the heater 102 is about 100Ω to about 500Ω. In some embodiments, the electrical resistance of the heater 102 is substantially greater than 500Ω. In some embodiments, the electrical resistance of the heater 102 is substantially about 100Ω.

In some embodiments, the pressure adjusting material 103 is disposed over the first substrate 101. In some embodiments, the pressure adjusting material 103 is disposed adjacent to the heater 102. In some embodiments, the pressure adjusting material 103 is above the heater 102. In some embodiments, the pressure adjusting material 103 is vertically aligned with the heater 102. In some embodiments, the heater 102 is disposed under the pressure adjusting material 103. In some embodiments, the pressure adjusting material 103 is at least partially in contact with the heater 102.

In some embodiments, the pressure adjusting material 103 includes organic or inorganic material. In some embodiments, the pressure adjusting material 103 is in solid, liquid or viscous state. In some embodiments, the pressure adjusting material 103 is a gel or grease. In some embodiments, the pressure adjusting material 103 includes silicon dioxide, silicon nitride, polymer, photoresist or any other suitable materials. In some embodiments, a thickness of the pressure adjusting material 103 is about 0.01 micrometers (um) to about 100 um. In some embodiments, a width of the heater 102 is substantially greater than a width of the pressure adjusting material 103.

In some embodiments, the pressure adjusting material 103 is configured to release a predetermined gas. In some embodiments, the pressure adjusting material 103 is a gas releasing material. In some embodiments, the predetermined gas is released from the pressure adjusting material 103 upon heating of the pressure adjusting material 103 by the heater 102. In some embodiments, the predetermined gas is released from the pressure adjusting material 103 when heat is generated and emitted from the heater 102. In some embodiments, the predetermined gas is released from the pressure adjusting material 103 when a voltage is applied to the heater 102 or an electric current is flowed through the heater 102. In some embodiments, the predetermined gas includes fluorine, chlorine, oxygen or any other suitable gases. In some embodiment, the predetermined gas is released from the pressure adjusting material 103 when a temperature of the heater 102 is increasing. In some embodiments, the predetermined gas is released from the pressure adjusting material 103 when the temperature of the heater 102 is increased to a predetermined temperature.

In some embodiments, the second substrate 104 is disposed over the first substrate 101. In some embodiments, the second substrate 104 is bonded over the first substrate 101. In some embodiments, the second substrate 104 is disposed over the heater 102. In some embodiments, the pressure adjusting material 103 is surrounded by the second substrate 104. In some embodiments, the second substrate 104 is a capping substrate or a capping wafer. In some embodiments, the second substrate 104 includes a recess 104a indented into the second substrate 104. In some embodiments, the recess 104a of the second substrate 104 is disposed above the heater 102 and the pressure adjusting material 103. In some embodiments, a portion of the pressure adjusting material 103 is disposed within the recess 104a.

In some embodiments, the second substrate 104 is a semiconductive substrate. In some embodiments, the second substrate 104 includes semiconductive material such as silicon, germanium, gallium, arsenic, or combinations thereof. In some embodiments, the second substrate 104 includes organic material.

In some embodiments, the first substrate 101 is bonded with the second substrate 104 by eutectic bonding. In some embodiments, a first pad 101c is disposed over an edge of the first substrate 101, and a second pad 104b is disposed over an edge of the second substrate 104 and surrounds the recess 104a. In some embodiments, the first pad 101c is bonded with the second pad 104b. In some embodiments, the first pad 101c includes aluminum copper alloy or any other suitable materials. In some embodiments, the second pad 104b includes germanium or any other suitable materials. In some embodiments, the first pad 101c and the second pad 104b are configured in annular shape respectively. In some embodiments, the first pad 101c and the second pad 104b are bonding ring respectively.

In some embodiments, the first substrate 101 is bonded with the second substrate 104 to form the cavity 105. In some embodiments, the cavity 105 is enclosed by the first substrate 101 and the second substrate 104. In some embodiments, the cavity 105 is sealed by the bonding of the first substrate 101 and the second substrate 104. In some embodiments, the cavity 105 is isolated from the surroundings.

In some embodiments, the pressure adjusting material 103 is disposed within the cavity 105. In some embodiments, a volume of the pressure adjusting material 103 is substantially greater than or equal to about 5% of a volume of the cavity 105. In some embodiments, the volume of the pressure adjusting material 103 is substantially less than 5% of the volume of the cavity 105. In some embodiments, the predetermined gas is released from the pressure adjusting material 103 to increase the pressure inside the cavity 105 when the pressure adjusting material 103 is heated by the heater 102. In some embodiments, a pressure inside the cavity 105 is substantially greater than a pressure of the surroundings outside the cavity 105. In some embodiments, a pressure inside the cavity 105 is substantially greater than 1 atmospheric pressure (atm).

Figure 2:
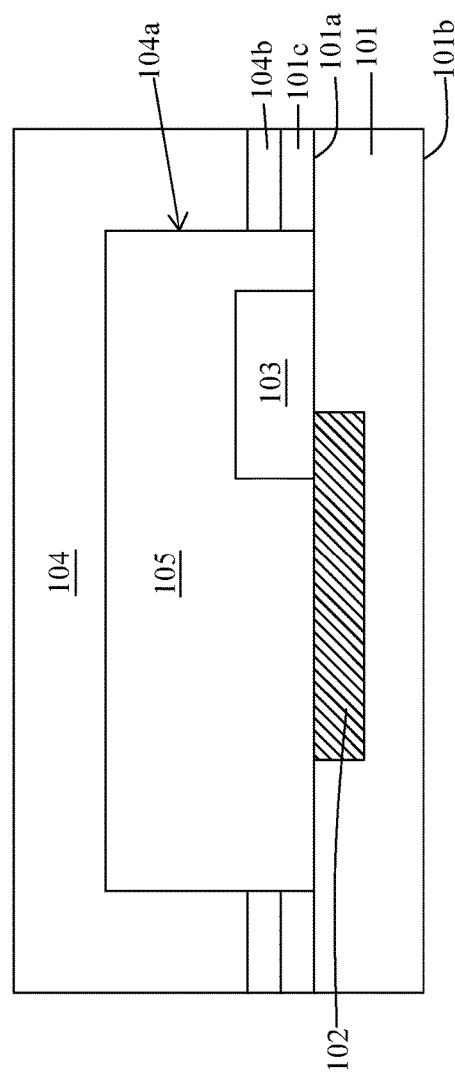
FIG. 2 is a schematic view of a semiconductor structure in accordance with some embodiments of the present disclosure.

FIG. 2 is a schematic cross sectional view of another semiconductor structure 200 in accordance with some embodiments of the present disclosure. In some embodiments, the semiconductor structure 200 includes a first substrate 101, a heater 102, a pressure adjusting material 103, a second substrate 104 and a cavity 105, which are in configurations similar to those in the semiconductor structure 100 described above or shown in FIG. 1.

In some embodiments as shown in FIG. 2, the pressure adjusting material 103 is shifted away from the heater 102. In some embodiments, the pressure adjusting material 103 is not vertically aligned with the heater 102. In some embodiments, the pressure adjusting material 103 is partially in contact with the heater 102. In some embodiments, a portion of the pressure adjusting material is in contact with the first surface 101a of the first substrate 101.

FIG. 3 is a schematic cross sectional view of another semiconductor structure 300 in accordance with some embodiments of the present disclosure. In some embodiments, the semiconductor structure 300 includes a first substrate 101, a heater 102, a pressure adjusting material 103, a second substrate 104 and a cavity 105, which are in configurations similar to those in the semiconductor structure 100 described above or shown in FIG. 1.

In some embodiments as shown in FIG. 3, the pressure adjusting material 103 is not in contact with the heater 102. In some embodiments, the pressure adjusting material 103 is disposed over the first surface 101a of the first substrate 101. In some embodiments, the pressure adjusting material 103 is in contact with the first substrate 101. In some embodiments, there is a gap D between the pressure adjusting material 103 and the heater 102. In some embodiments, the gap D is substantially less than 1 um. In some embodiments, a heat is generated from the heater 102, and the heat is transferred from the heater 102 to the pressure adjusting material 103 by convection or radiation, such that the pressure adjusting material 103 is heated by the heater 102 and the predetermined gas is released from the pressure adjusting material 103.

FIG. 4 is a schematic cross sectional view of another semiconductor structure 400 in accordance with some embodiments of the present disclosure. In some embodiments, the semiconductor structure 400 includes a first substrate 101, a heater 102, a pressure adjusting material 103, a second substrate 104 and a cavity 105, which are in configurations similar to those in the semiconductor structure 100 described above or shown in FIG. 1.

In some embodiments as shown in FIG. 4, the pressure adjusting material 103 is not in contact with the heater 102. In some embodiments, the pressure adjusting material 103 is disposed over the first surface 101a of the first substrate 101. In some embodiments, the pressure adjusting material 103 is in contact with the first substrate 101. In some embodiments, the pressure adjusting material 103 is disposed above the heater 102. In some embodiments, a portion of the first substrate 101 is disposed between the pressure adjusting material 103 and the heater 102.

In some embodiments, there is a gap D between the pressure adjusting material 103 and the heater 102. In some embodiments, the gap D is substantially less than 1 um. In some embodiments, a heat is generated from the heater 102, and the heat is conducted from the heater 102 to the pressure adjusting material 103 through the first substrate 101, such that the pressure adjusting material 103 is heated by the heater 102 and the predetermined gas is released from the pressure adjusting material 103.

Figure 5:
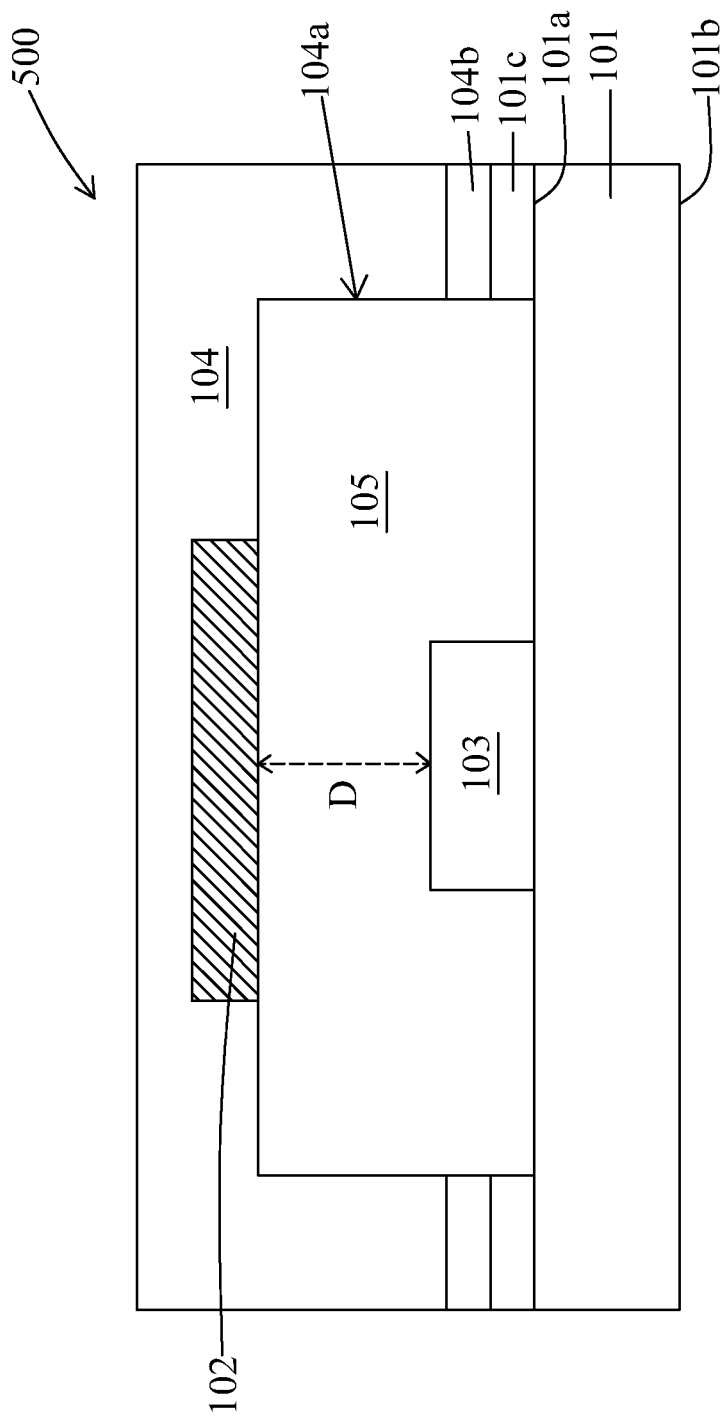
FIG. 5 is a schematic view of a semiconductor structure in accordance with some embodiments of the present disclosure.

FIG. 5 is a schematic cross sectional view of another semiconductor structure 500 in accordance with some embodiments of the present disclosure. In some embodiments, the semiconductor structure 500 includes a first substrate 101, a heater 102, a pressure adjusting material 103, a second substrate 104 and a cavity 105, which are in configurations similar to those in the semiconductor structure 100 described above or shown in FIG. 1.

In some embodiments as shown in FIG. 5, the pressure adjusting material 103 is not in contact with the heater 102. In some embodiments, the heater 102 is surrounded by the second substrate 104. In some embodiments, the heater 102 is at least partially exposed from the second substrate 104. In some embodiments, the heater 102 is disposed above the pressure adjusting material 103. In some embodiments, the pressure adjusting material 103 is disposed over the first surface 101a of the first substrate 101. In some embodiments, the pressure adjusting material 103 is in contact with the first substrate 101.

In some embodiments, there is a gap D between the pressure adjusting material 103 and the heater 102. In some embodiments, the gap D is substantially less than 1 um. In some embodiments, a heat is generated from the heater 102, and the heat is transferred from the heater 102 to the pressure adjusting material 103 by convection or radiation, such that the pressure adjusting material 103 is heated by the heater 102 and the predetermined gas is released from the pressure adjusting material 103.

FIG. 6 is a schematic cross sectional view of another semiconductor structure 600 in accordance with some embodiments of the present disclosure. In some embodiments, the semiconductor structure 600 includes a first substrate 101, a heater 102, a pressure adjusting material 103, a second substrate 104 and a cavity 105, which are in configurations similar to those in the semiconductor structure 100 described above or shown in FIG. 1.

In some embodiments as shown in FIG. 6, an intermediate member 106 is disposed between the heater 102 and the pressure adjusting material 103. In some embodiments, the intermediate member 106 is in contact with the heater 102 and the pressure adjusting material 103. In some embodiments, a surface of the pressure adjusting material 103 is entirely in contact with the intermediate member 106. In some embodiments, the intermediate member 106 is disposed within the cavity 105. In some embodiments, the heater 102, the pressure adjusting material 103 and the intermediate member 106 are vertically aligned with each other.

In some embodiments, the intermediate member 106 is thermally conductive. In some embodiments, the intermediate member 106 is configured to conduct heat from the heater 102 to the pressure adjusting material 103. In some embodiments, the intermediate member 106 is inert to the pressure adjusting material 103 and the heater 102. In some embodiments, the intermediate member 106 includes oxide, nitride or any other suitable materials. In some embodiments, a width of the intermediate member 106 is substantially the same as the width of the heater 102. In some embodiments, the width of the intermediate member 106 is substantially greater than or the same as the width of the pressure adjusting material 103.

FIG. 7 is a schematic cross sectional view of another semiconductor structure 700 in accordance with some embodiments of the present disclosure. In some embodiments, the semiconductor structure 700 includes a first substrate 101, a heater 102, a pressure adjusting material 103, a second substrate 104, a cavity 105 and an intermediate member 106, which are in configurations similar to those in the semiconductor structure 600 described above or shown in FIG. 6.

In some embodiments as shown in FIG. 7, the heater 102, the pressure adjusting material 103 and the intermediate member 106 are not vertically aligned with each other. In some embodiments, the intermediate member 106 is partially in contact with the heater 102 and is entirely in contact with the pressure adjusting material 103. In some embodiments, the intermediate member 106 is partially in contact with the first surface 101a of the first substrate 101. In some embodiments, the width of the intermediate member 106 is substantially greater than or the same as the width of the pressure adjusting material 103.

FIG. 8 is a schematic cross sectional view of another semiconductor structure 800 in accordance with some embodiments of the present disclosure. In some embodiments, the semiconductor structure 800 includes a first substrate 101, a heater 102, a pressure adjusting material 103, a second substrate 104 and a cavity 105, which are in configurations similar to those in the semiconductor structure 100 described above or shown in FIG. 1.

In some embodiments as shown in FIG. 8, an electrical component 107 is disposed over the first substrate 101. In some embodiments, the electrical component 107 is configured to operate in the cavity 105 and under a predetermined pressure. In some embodiments, the predetermined pressure is substantially greater than 1 atm. In some embodiments, the predetermined pressure is substantially less than 1 atm. In some embodiments, the electrical component 107 is temperature sensitive (i.e. damage by a high temperature). In some embodiments, the electrical component 107 is an accelerometer for measuring linear acceleration. In some embodiments, the electrical component 107 is a sensor for sensing motion, pressure, etc.

In some embodiments, the pressure adjusting material 103 is heated by the heater 102 to increase pressure of the cavity 105. In some embodiments, the pressure of the cavity 105 is increased to about the predetermined pressure, such that the electrical component 107 can operate under the predetermined pressure. Since the electrical component 107 is disposed in a distance (for example, substantially greater than 10 um) away from the heater 102 and the pressure adjusting material 103, heat from the heater 102 would not affect or transmit to the electrical component 107 upon heating of the pressure adjusting material 103 by the heater 102. The electrical component 107 would not be heated by the heater 102 upon heating of the pressure adjusting material 103, and therefore would not be damaged by the heating. As such, the electrical component 107 can operate under the predetermined pressure after the heating of the pressure adjusting material 103, while the electrical component 107 would not be damaged by the heating.

FIG. 9 is a schematic cross sectional view of another semiconductor structure 900 in accordance with some embodiments of the present disclosure. In some embodiments, the semiconductor structure 900 includes a first substrate 101, a heater 102, a pressure adjusting material 103, a second substrate 104, a first cavity 105 and an electrical component 107, which are in configurations similar to those in the semiconductor structure 800 described above or shown in FIG. 8.

In some embodiments as shown in FIG. 9, the second substrate 104 includes a first recess 104a and a second recess 104c indented into the second substrate 104. In some embodiments, the first cavity 105 is defined by the first recess 104a and the first substrate 101. In some embodiments, the first cavity 105 is disposed above the heater 102. In some embodiments, a second cavity 108 is defined by the second recess 104c and the first substrate 101. In some embodiments, the second cavity 108 is disposed adjacent to the first cavity 105. In some embodiments, the heater 102 and the pressure adjusting material 103 are in the first cavity 105, and the electrical component 107 is in the second cavity 108.

In some embodiments, the first cavity 105 and the second cavity 108 are isolated from each other. In some embodiments, a pressure of the first cavity 105 is substantially different from a pressure of the second cavity 108. In some embodiments, the pressure of the first cavity 105 is substantially greater than the pressure of the second cavity 108. In some embodiments, the second cavity 108 is in a vacuum or in the pressure substantially less than 1 atm. In some embodiments, the pressure of the first cavity 105 is substantially less than the pressure of the second cavity 108. In some embodiments, the first cavity 105 is in a vacuum or in the pressure substantially less than 1 atm. In some embodiments, the first cavity 105 and the second cavity 108 are respectively in the pressure substantially less than 1 atm. In some embodiments, the electrical component 107 is configured to operate under the pressure of the second cavity 108 substantially different from the pressure of the first cavity 105.

Since the electrical component 107 is separated from the heater 102 and the pressure adjusting material 103, heat from the heater 102 would not affect or transmit to the electrical component 107 upon heating of the pressure adjusting material 103 by the heater 102. The electrical component 107 would not be heated by the heater 102 upon heating of the pressure adjusting material 103, and therefore would not be damaged by the heating.

Figure 10:
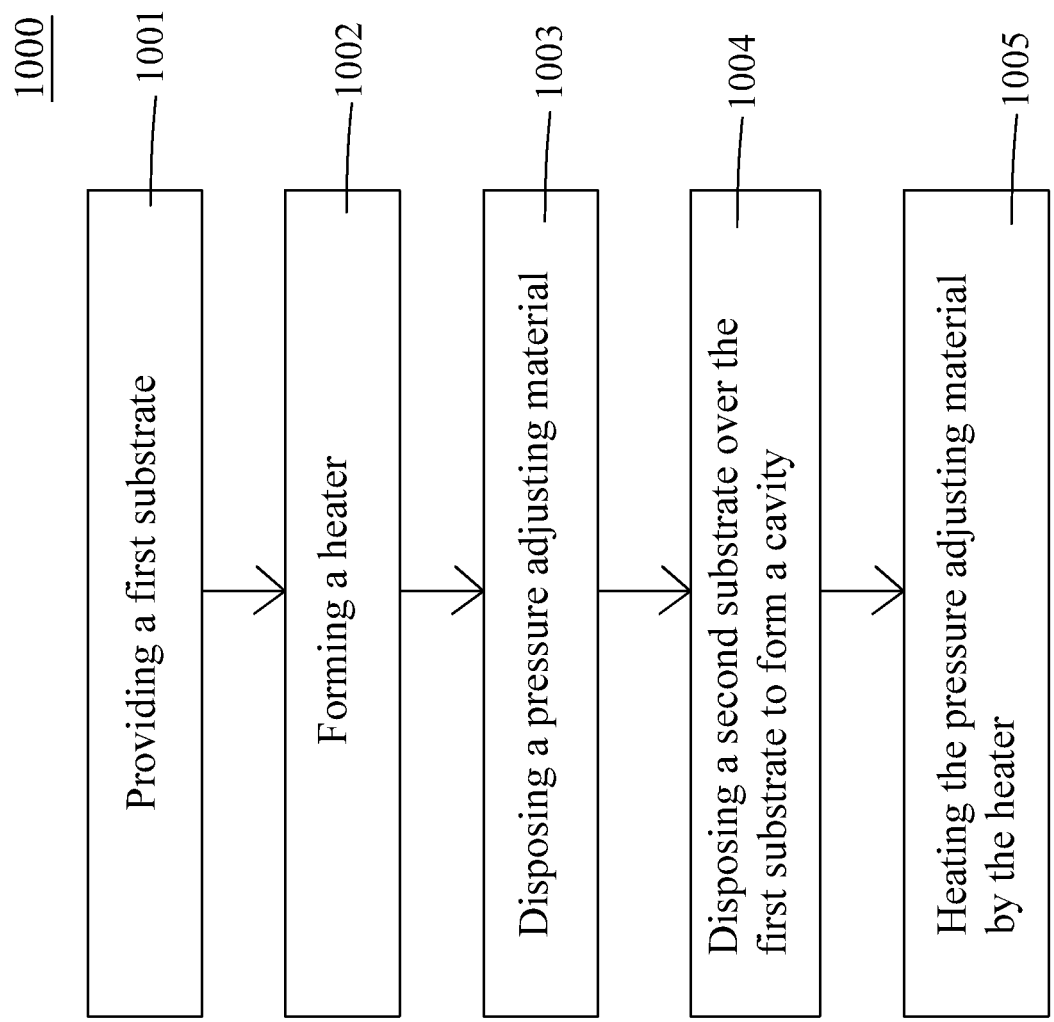
FIG. 10 is a flow diagram of a method of manufacturing a semiconductor structure in accordance with some embodiments of the present disclosure.

In the present disclosure, a method of manufacturing a semiconductor structure is also disclosed. In some embodiments, a semiconductor structure 100, 200, 300, 400, 500, 600, 700, 800 or 900 is formed by a method 1000. The method 1000 includes a number of operations and the description and illustration are not deemed as a limitation as the sequence of the operations. FIG. 10 is an embodiment of the method 1000 of manufacturing a semiconductor structure 100, 200, 300, 400, 500, 600, 700, 800 or 900. The method 1000 includes a number of operations (1001, 1002, 1003, 1004 and 1005).

Figure 11:
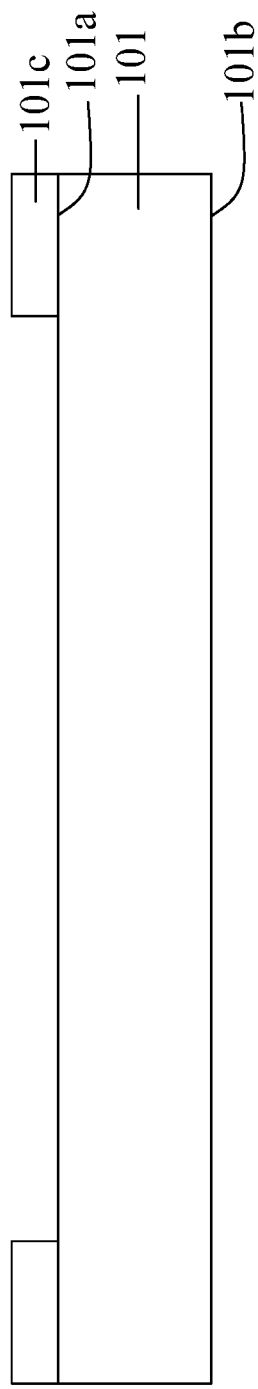
FIGS. 11-15 are schematic views of manufacturing a semiconductor structure by a method of FIG. 10 in accordance with some embodiments of the present disclosure.

In operation 1001, a first substrate 101 is received or provided as shown in FIG. 11. In some embodiments, the first substrate 101 is a semiconductive substrate. In some embodiments, the first substrate 101 is a device substrate or a device wafer. In some embodiments, the first substrate 101 includes a first surface 101a and a second surface 101b opposite to the first surface 101a.

In some embodiments, a first pad 101c is formed over the first substrate 101. In some embodiments, the first pad 101c is formed over the first surface 101a of the first substrate 101. In some embodiments, the first pad 101c is formed by sputtering, electroplating or any other suitable operations. In some embodiments, the first substrate 101 and the first pad 101c is in configurations as described above or shown in FIG. 1.

Figure 12:
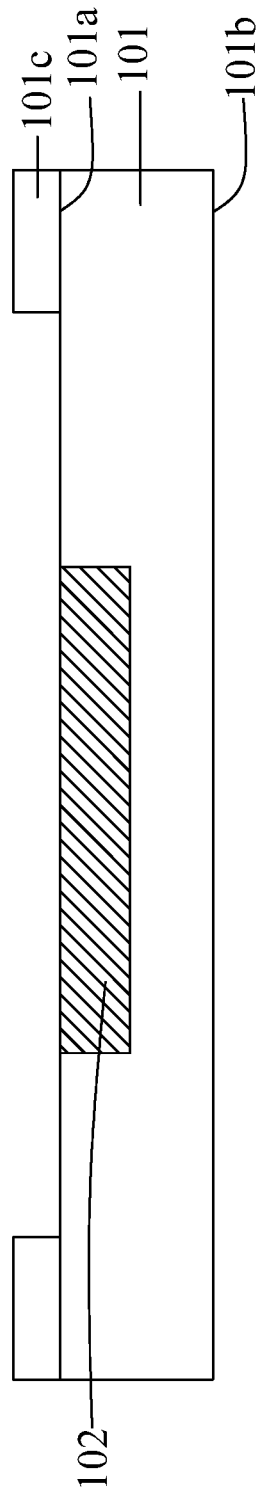

In operation 1002, a heater 102 is formed as shown in FIG. 12. In some embodiments, the heater 102 is formed over the first substrate 101. In some embodiments, the heater 102 is formed over the first surface 101a of the first substrate 101. In some embodiments, the heater 102 is surrounded by the first substrate 101. In some embodiments, the heater 102 is formed by deposition of a material with a suitable electrical resistance over the first substrate 101. In some embodiments, after the deposition of the material, some portions of the material are removed by photolithography, etching or any other suitable operations. In some embodiments, the heater 102 is formed based on MEMS fabrication. In some embodiments, the heater 102 is a resistor with an electrical resistance substantially greater than 100Ω (Ohm). In some embodiments, the electrical resistance of the heater 102 is about 100Ω to about 500Ω. In some embodiments, the heater 102 is in configurations as described above or shown in FIG. 1. In some embodiments, the heater 102 is formed (the operation 1002) prior to the formation of the first pad 101c over the first substrate 101 (as described above).

Figure 13:
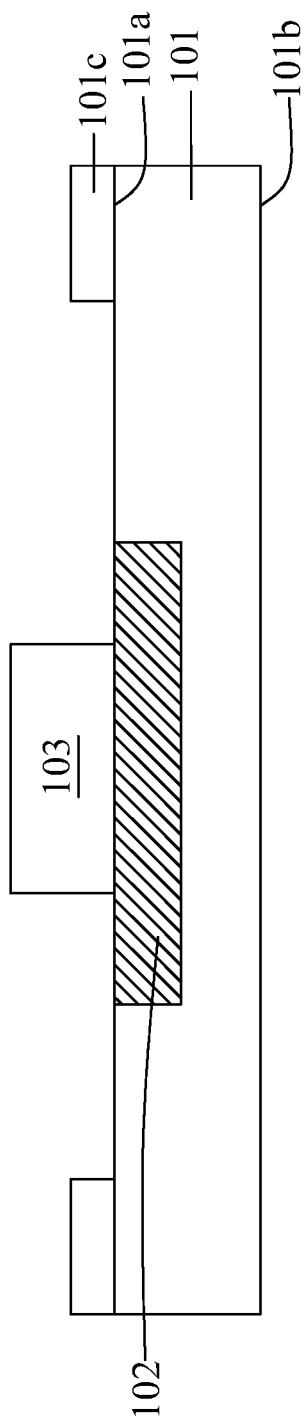

In operation 1003, a pressure adjusting material 103 is disposed over the first substrate 101 as shown in FIG. 13. In some embodiments, the pressure adjusting material 103 is disposed above the heater 102. In some embodiments, the pressure adjusting material 103 is at least partially in contact with the heater 102. In some embodiments, the pressure adjusting material 103 is disposed away from the heater 102 in a distance (for example, substantially less than 1 um). In some embodiments, the pressure adjusting material 103 is disposed by chemical vapor deposition (CVD) or any other suitable operations. In some embodiments, the pressure adjusting material 103 is configured to release a predetermined gas. In some embodiments, the predetermined gas is released from the pressure adjusting material 103 upon heating of the pressure adjusting material 103 by the heater 102. In some embodiments, the pressure adjusting material 103 is in configurations as described above or shown in FIG. 1.

Figure 14:
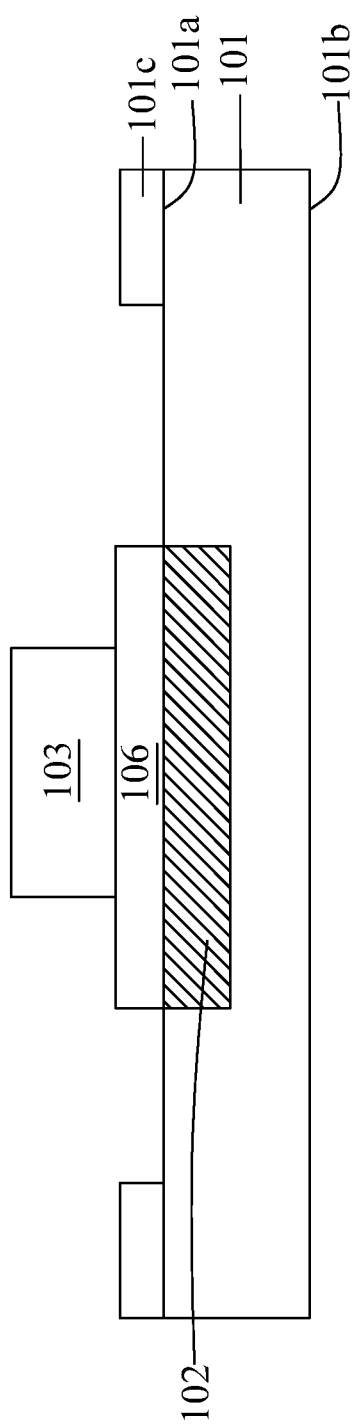

In some embodiments as shown in FIG. 14, an intermediate member 106 is formed prior to the formation of the pressure adjusting material 103. In some embodiments, the intermediate member 106 is formed over and is in contact with the heater 102. In some embodiments, a surface of the intermediate member 106 is at least partially in contact with the heater 102. In some embodiments, the intermediate member 106 is configured to conduct heat from the heater 102 to the pressure adjusting material 103. In some embodiments, the intermediate member 106 is formed by CVD or any other suitable operations. In some embodiments, the intermediate member 106 is in configurations as described above or shown in FIG. 1.

Figure 15:
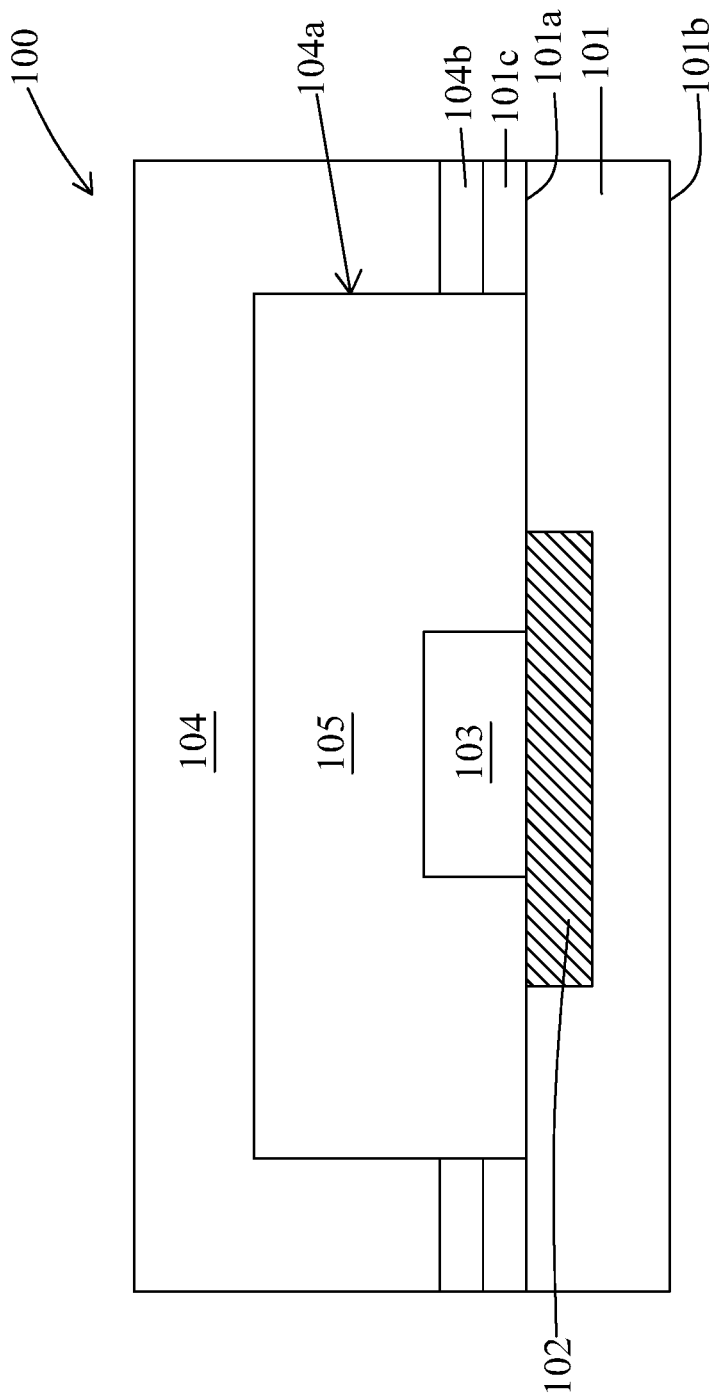

In operation 1004, a second substrate 104 is disposed over the first substrate 101 to form a cavity 105 as shown in FIG. 15. In some embodiments, the second substrate 104 is a capping substrate or a capping wafer. In some embodiments, the second substrate 104 is bonded over the first substrate 101. In some embodiments, a second pad 104b is formed over the second substrate 104 prior to the bonding of the second substrate 104 with the first substrate 101. In some embodiments, the second pad 104b is formed by sputtering, electroplating or any other suitable operations.

In some embodiments, the second substrate 104 is bonded with the first substrate 101 by bonding the first pad 101c on the first substrate 101 with the second pad 104b on the second substrate 104. In some embodiments, the second substrate 104 is bonded with the first substrate 101 by eutectic bonding or any other suitable operations. In some embodiments, the first pad 101c is eutectically bonded with the second pad 104b.

In some embodiments, a cavity 105 is formed after the bonding of the second substrate 104 with the first substrate 101. In some embodiments, the cavity 105 is sealed after the bonding of the second substrate 104 with the first substrate 101. In some embodiments, the pressure adjusting material 103 is disposed within the cavity 105. In some embodiments, the second substrate 104, he second pad 104b and the cavity 105 are in configurations as described above or shown in FIG. 1. In some embodiments, a semiconductor structure 100 with configurations as described above or shown in FIG. 1 is formed.

In operation 1005, the pressure adjusting material 103 is heated by the heater 102 to adjust a pressure of the cavity 105. In some embodiments, heat is emitted from the heater 102 and conducted to the pressure adjusting material 103 to heat the pressure adjusting material 103. In some embodiments, a predetermined gas is released from the pressure adjusting material 103 upon the heating of the pressure adjusting material 103. In some embodiments, the heater 102 generates and emits heat when a voltage is applied to the heater 102 or an electric current is flowed through the heater 102. In some embodiments, a pressure measurement device is disposed over the first substrate 101 or the second substrate 104. In some embodiments, the pressure measurement device is configured to measure or monitor the pressure within the cavity 105 and feedback to the heater 102 based on the pressure within the cavity 105. In some embodiments, the heater 102 is controlled or adjusted in response to the pressure within the cavity 105 based on the feedback from the pressure measurement device.

In some embodiments, the pressure of the cavity 105 is increased after the heating of the pressure adjusting material 103 by the heater 102. In some embodiments, the predetermined gas is released from the pressure adjusting material 103 to the cavity 105, as such the pressure of the cavity 105 is increased. In some embodiments, the pressure of the cavity 105 is substantially greater than a pressure of the surroundings or a pressure outside the cavity 105 upon or after the heating of the pressure adjusting material 103. In some embodiments, the pressure of the cavity 105 is substantially greater than 1 atm upon or after the heating of the pressure adjusting material 103. In some embodiments, the pressure of the cavity 105 is substantially less than 1 atm upon or after the heating of the pressure adjusting material 103.

The present disclosure is directed to a semiconductor structure including a first substrate, a heater surrounded by the first substrate, a pressure adjusting material disposed over the first substrate and adjacent to the heater, a second substrate disposed over the first substrate, and a cavity enclosed by the first substrate and the second substrate. The pressure adjusting material would release a predetermined gas to increase a pressure of the cavity upon heating of the pressure adjusting material by the heater. Such configuration can minimize or prevent heating of other components (especially temperature sensitive components such as accelerometer, etc.) over the substrate. Therefore, other components over the substrate would not be damaged by the heat emitted from the heater.

In some embodiments, a semiconductor structure includes a first substrate; a heater surrounded by the first substrate; a pressure adjusting material disposed over the first substrate and adjacent to the heater; a second substrate disposed over the first substrate; and a cavity enclosed by the first substrate and the second substrate, wherein the pressure adjusting material is disposed within the cavity.

In some embodiments, the heater is disposed under the pressure adjusting material. In some embodiments, the pressure adjusting material is at least partially in contact with the heater. In some embodiments, the pressure adjusting material is vertically aligned with the heater. In some embodiments, an electrical resistance of the heater is substantially greater than 100 Ohm. In some embodiments, a width of the heater is substantially greater than a width of the pressure adjusting material.

In some embodiments, a gap between the pressure adjusting material and the heater is substantially less than 1 um. In some embodiments, the heater is at least partially exposed from the first substrate. In some embodiments, a pressure inside the cavity is substantially greater than 1 atm. In some embodiments, the semiconductor structure further includes an intermediate member disposed between and contacted with the pressure adjusting material and the heater. In some embodiments, the intermediate member is thermally conductive and inert to the pressure adjusting material and the heater.

In some embodiments, a semiconductor structure includes a first substrate; a heat emitting resistor surrounded by the first substrate; a gas releasing material disposed over the first substrate and adjacent to the heat emitting resistor; a second substrate disposed over the first substrate and including a first recess and a second recess indented into the second substrate; a first cavity defined by the first recess of the second substrate and the first substrate; and a second cavity defined by the second recess of the second substrate and the first substrate, wherein the gas releasing material is disposed within the first cavity.

In some embodiments, a pressure of the first cavity is substantially different from a pressure of the second cavity. In some embodiments, a pressure of the first cavity is substantially greater than a pressure of the second cavity. In some embodiments, an electrical resistance of the heat emitting resistor is about 100 Ohm to about 500 Ohm. In some embodiments, the first cavity is disposed above the heat emitting resistor.

In some embodiments, a method of manufacturing a semiconductor structure includes receiving a first substrate; forming a heater surrounded by the first substrate; disposing a pressure adjusting material over the first substrate; disposing a second substrate over the first substrate to form a cavity; and heating the pressure adjusting material by the heater to adjust a pressure of the cavity.

In some embodiments, the pressure of the cavity is increased after the heating of the pressure adjusting material by the heater. In some embodiments, a predetermined gas is released from the pressure adjusting material upon the heating of the pressure adjusting material. In some embodiments, the method further includes providing an electric current flowing through the heater, wherein heat is generated and emitted from the heater upon the provision of the electric current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first substrate;
a heater surrounded by the first substrate;
a pressure adjusting material disposed over the first substrate and in contact with the heater;
a second substrate disposed over the first substrate; and
a cavity enclosed by the first substrate and the second substrate,
wherein the pressure adjusting material is disposed within the cavity.

2. The semiconductor structure of claim 1, wherein the heater is disposed under the pressure adjusting material.

3. The semiconductor structure of claim 1, wherein the pressure adjusting material is at least partially in contact with the first substrate.

4. The semiconductor structure of claim 1, wherein the pressure adjusting material is vertically aligned with the heater.

5. The semiconductor structure of claim 1, wherein an electrical resistance of the heater is substantially greater than 100 Ohm.

6. The semiconductor structure of claim 1, wherein a width of the heater is substantially greater than a width of the pressure adjusting material.

7. The semiconductor structure of claim 1, wherein a volume of the pressure adjusting material is substantially greater than or equal to about 5% of a volume of the cavity.

8. The semiconductor structure of claim 1, wherein the heater is at least partially exposed from the first substrate.

9. The semiconductor structure of claim 1, wherein a pressure inside the cavity is substantially greater than 1 atm.

10. The semiconductor structure of claim 1, wherein the heater includes platinum, copper, tungsten, nickel or polysilicon.

11. The semiconductor structure of claim 1, wherein the heater is an electric coil.

12. A semiconductor structure, comprising:
   a first substrate;
   a heat emitting resistor surrounded by the first substrate;
   a gas releasing material disposed over the first substrate and in contact with the heat emitting resistor;
   a second substrate disposed over the first substrate and including a first recess and a second recess indented into the second substrate;
   a first cavity defined by the first recess of the second substrate and the first substrate; and
   a second cavity defined by the second recess of the second substrate and the first substrate,
   wherein the gas releasing material is disposed within the first cavity.

13. The semiconductor structure of claim 12, wherein a pressure of the first cavity is substantially different from a pressure of the second cavity.

14. The semiconductor structure of claim 12, wherein a pressure of the first cavity is substantially greater than a pressure of the second cavity.

15. The semiconductor structure of claim 12, wherein an electrical resistance of the heat emitting resistor is about 100 Ohm to about 500 Ohm.

16. The semiconductor structure of claim 12, wherein the first cavity is disposed above the heat emitting resistor.

17. A semiconductor structure, comprising:
   a first substrate;
   a second substrate disposed over the first substrate;
   a cavity defined by the first substrate and the second substrate;
   a heater surrounded by the first substrate; and
   a pressure adjusting material disposed over and interfacing with the heater.

18. The semiconductor structure of claim 17, wherein an interface between the pressure adjusting material and the heater has a width substantially less than a width of the pressure adjusting material.

19. The semiconductor structure of claim 17, wherein an interface between the pressure adjusting material and the heater has a width substantially same as a width of the pressure adjusting material.

20. The semiconductor structure of claim 17, wherein the pressure adjusting material is disposed above the heater.

* * * * *